US008892405B1

(12) United States Patent
Michal

(10) Patent No.: US 8,892,405 B1
(45) Date of Patent: Nov. 18, 2014

(54) SYSTEM AND METHOD FOR TRANSFERRING ANALYSIS PROPERTIES BETWEEN GEOMETRY MODELS

(75) Inventor: Todd Richard Michal, Wentzville, MO (US)

(73) Assignee: The Boeing Company, Chicago, IL (US)

( * ) Notice: Subject to any disclaimer, the term of this patent is extended or adjusted under 35 U.S.C. 154(b) by 356 days.

(21) Appl. No.: 13/275,618

(22) Filed: Oct. 18, 2011

(51) Int. Cl.
*G06F 17/50* (2006.01)
*G06T 17/00* (2006.01)
*G06T 15/00* (2011.01)
*G06T 15/08* (2011.01)

(52) U.S. Cl.
CPC ............... *G06T 17/00* (2013.01); *G06T 15/08* (2013.01); *G06T 17/005* (2013.01); *G06T 15/00* (2013.01)
USPC ............................................................. 703/1

(58) Field of Classification Search
None
See application file for complete search history.

(56) References Cited

U.S. PATENT DOCUMENTS

| 6,879,946 | B2 | 4/2005 | Rong et al. | |
|---|---|---|---|---|
| 6,895,371 | B1 | 5/2005 | Ames et al. | |
| 7,403,268 | B2 | 7/2008 | England et al. | |
| 8,099,265 | B2* | 1/2012 | Houston | 703/9 |
| 2006/0290695 | A1* | 12/2006 | Salomie | 345/420 |
| 2009/0055137 | A1 | 2/2009 | Gargouri et al. | |
| 2012/0163672 | A1* | 6/2012 | McKinnon | 382/106 |
| 2012/0232858 | A1* | 9/2012 | Zhou et al. | 703/2 |
| 2012/0306878 | A1* | 12/2012 | Wang et al. | 345/426 |
| 2013/0173239 | A1* | 7/2013 | Uemura et al. | 703/2 |

OTHER PUBLICATIONS

P. Cignoni, C. Montani, C. Rocchini, R. Scopigno, M. Tarini Preserving Attribute Values on Simplified Meshes by Resampling Detail Textures The Visual Computer (1999) 15:519-539, Springer-Verilag 1999.*
Uva et al. Distributed Design Review Using Tangible Augmented Technical Drawings Elsevier Ltd., May 2010, pp. 364-372.*
Eall et al. A Comparison of Techniques for Geometry Access Related to Mesh Generation Engineering with Computers, 20: pp. 210-221, Aug. 2004.*

* cited by examiner

*Primary Examiner* — Omar Fernandez Rivas
*Assistant Examiner* — Cuong Luu
(74) *Attorney, Agent, or Firm* — Armstrong Teasdale LLP

(57) ABSTRACT

A system enables a transfer of analysis properties between geometry models and includes a memory for storing analysis properties of a first model that includes a plurality of components, each component assigned to one or more of the analysis properties and each component assigned to one or more voxels in a coordinate system based on component location. The system includes a processor programmed to receive data corresponding to a second model comprising a plurality of components, access analysis properties of the first model, apply the coordinate system to the second model, using the coordinate system and analysis properties assigned to each voxel in the coordinate system, map the plurality of components of the second model to one or more voxels in the coordinate system, and assign analysis properties of the first model to components of the second model based on voxel mapping to the components of the second model.

23 Claims, 3 Drawing Sheets

SYSTEM AND METHOD FOR TRANSFERRING ANALYSIS PROPERTIES BETWEEN GEOMETRY MODELS

BACKGROUND

The present disclosure relates generally to transferring analysis properties between geometry models.

Computational simulation has come to play an increasingly dominant role in the engineering design process. Computer aided design (CAD) methods have essentially replaced the drawing board as the basic tool to define product configurations. Similarly, during a design process, many types of analysis are now almost entirely carried out by computational methods.

Conventionally, analyses require a preprocessing step to assign properties to components (e.g., nodes, edges, surfaces, and volumes) of a model. This is particularly true during the creation of a computational mesh where properties may be specified at a large number of locations on the model. For example, it is not uncommon for these properties to number in the 1000's and once the geometry of the model is changed, all of the property specifications must be assigned to the new model before the new model can be analyzed in various analysis tools. However, re-specification of the analysis properties with each model change is inefficient, a costly waste of an analyst's time, and slows a design process resulting in further costs and delays to an overall product development cycle.

SUMMARY

In one aspect, a system is configured to enable a transfer of analysis properties between geometry models. The system includes a memory area for storing analysis properties of a first model that includes a plurality of components, wherein each of the plurality of components are assigned to one or more of the analysis properties and wherein each of the plurality of components are assigned to one or more voxels in a coordinate system based on a location of the one or more components. The system further includes a processor programmed to receive data corresponding to a second model comprising a plurality of components, access the analysis properties of the first model, apply the coordinate system to the second model, using the coordinate system and the analysis properties assigned to each voxel in the coordinate system, map the plurality of components of the second model to one or more voxels in the coordinate system, and assign the analysis properties of the first model to each of the plurality of components of the second model based on the mapping of each voxel to the plurality of components of the second model.

In another aspect, a method for transferring analysis properties between geometry models is provided. The method includes receiving data corresponding to a first model comprising a plurality of components, each of the plurality of components comprising one or more analysis properties, assigning each of the analysis properties to one or more voxels in a coordinate system based on a location of each of the plurality of components in the coordinate system, receiving data corresponding to a second model comprising a plurality of components, applying the coordinate system to the second model, using the coordinate system and the analysis properties assigned to each voxel in the coordinate system, mapping the plurality of components of the second model to corresponding voxels in the coordinate system, and assigning the analysis properties of the first model to each of the plurality of components of the second model based on the mapping of the plurality of components of the second model to corresponding voxels in the coordinate system.

In yet another aspect, one or more computer-readable media including computer-executable instructions for transferring analysis properties between geometry models is provided. The computer-executable instructions direct a processor to access data corresponding to a first model comprising a plurality of components, each of the plurality of components comprising one or more analysis properties, assign each of the analysis properties to one or more voxels in a coordinate system based on a location of each of the plurality of components in the coordinate system, access data corresponding to a second model comprising a plurality of components, apply the coordinate system to the second model, using the coordinate system and the analysis properties assigned to each voxel in the coordinate system, map the plurality of components of the second model to one or more voxels in the coordinate system, and assign the analysis properties of the first model to each of the plurality of components of the second model based on the mapping of each voxel in the coordinate system to the plurality of components of the second model.

BRIEF DESCRIPTION OF THE DRAWINGS

The present disclosure is described in detail below with reference to the attached drawing figures.

DETAILED DESCRIPTION

Figure 1:
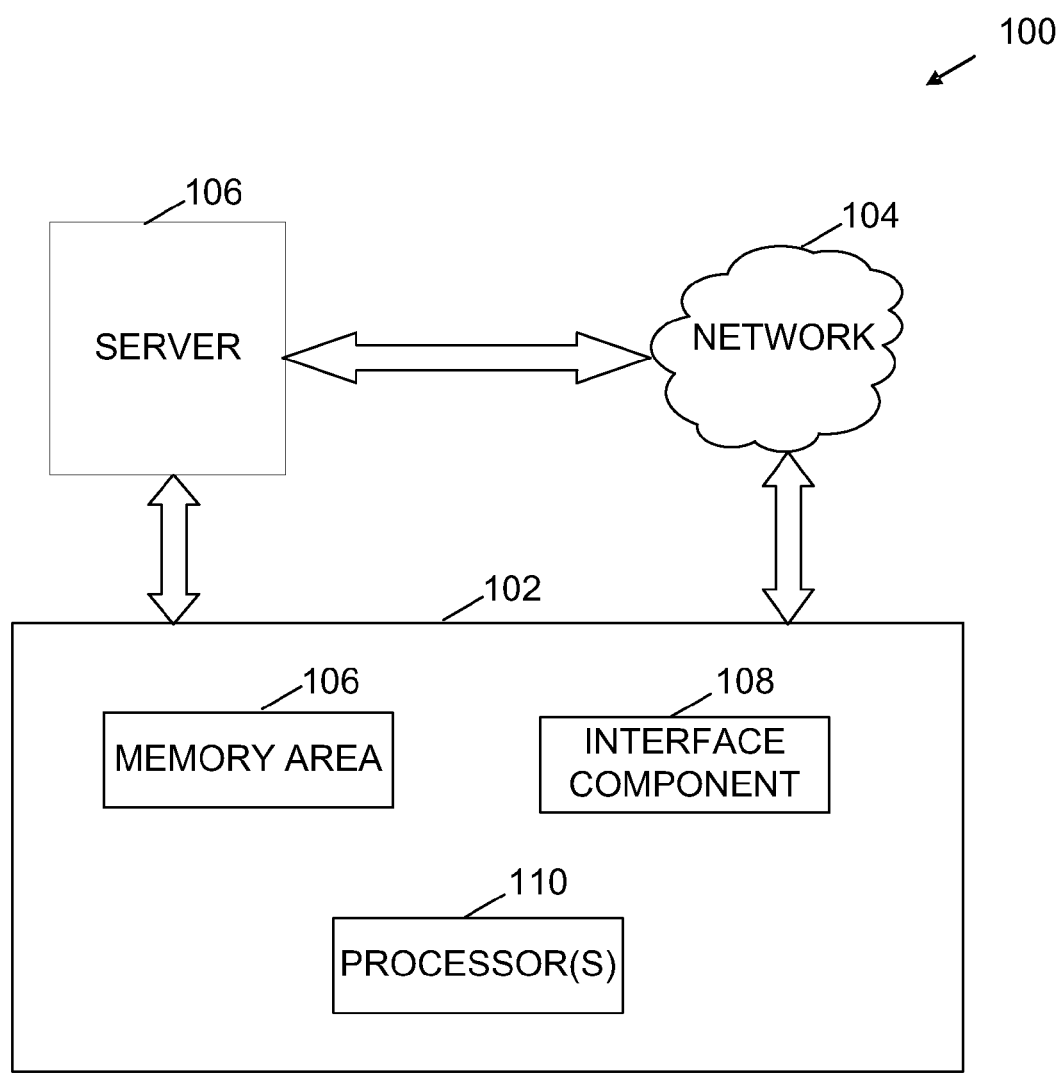
FIG. 1 is an exemplary block diagram of a system for transferring analysis properties between geometry models.

The present disclosure provides systems and methods to transfer properties from one geometry model (e.g., a host model) to a second geometry model (e.g., a target model) by use of, for example, interpolation from a background functional representation of geometry properties. In one embodiment, the functional representation is modeled on an adaptively refined Cartesian background mesh that spans either a two-dimensional (2-D) space or a three-dimensional (3-D) space of the host and target geometry models. In one embodiment, each of the properties assigned to the host model may be represented by a mathematical basis function within each element of the background mesh. Binary or constant valued properties, such as material properties, can be modeled with a constant in each background mesh element and distributed properties, such as mesh size, can be represented with a linear or higher-order basis function. As described in further detail below, each parameter is mapped to the new geometry model by evaluating the background functional representation at an appropriate location of the new geometry model in the 2-D or 3-D space. Further, searches of the background functional representation are rapid due to a quadtree or octree nature of the data representation (as described in further detail below). As such, compared to approaches that do not map property data, the systems and methods described herein avoid the costly re-assignment of properties step.

Traditional mapping methods also require finding a one-to-one match for each piece of a geometry model tree (e.g., nodes, edges, surfaces, and the like) between a host and a target model. However, this is an expensive operation that requires $N^2$ operations (where N can be very large and N is, e.g., nodes, edges, surfaces, and the like) and it precludes mapping of properties between host and target models that are similar but slightly different. In addition, use of a one-to-one mapping restricts use to cases where a topological relationship exists between the host and target models. These restrictions do not apply to the systems and methods described in the present disclosure.

Further, methods that currently map properties are typically embedded directly in a single CAD geometry package and are limited to operating within a single CAD environment and only with the analysis tools that are embedded in that CAD environment. Thus, if a CAD geometry package does not include proper analysis tools, the proper analysis tools may be integrated directly within the CAD software. However, integrating analysis tools directly within CAD software can be a costly proposition as the CAD software is likely proprietary thus requiring the CAD company to participate in the integration. Unlike current mapping properties, the present disclosure enables properties between models to be mapped even when a host and target model originated in different CAD packages using analysis tools that are not directly embedded in the CAD system.

Referring now to FIG. 1, an exemplary block diagram illustrates a system 100 that includes a computing device 102, a network 104, and a server 106. While some embodiments of the disclosure are illustrated and described herein with reference to server 106 being a server computing device, embodiments of the disclosure are operable with netbooks, desktop computing devices, laptop computers, and other computing devices. In such embodiments, data may be stored by a cloud service and accessible by any computing device implementing functionality of the disclosure.

As shown in FIG. 1, computing device 102 includes a memory area 106, an interface component 108, and at least one processor 110. Interface component 108 enables an exchange of data between computing device 102 and server 106 and network 104. Each of memory area 106, interface component 108 and processor 110 may be separate from computing device 102 or integrated into computing device 102 (as shown in FIG. 1).

In one embodiment, memory area 106 stores analysis properties of a host model that includes a plurality of components, each of the plurality of components being assigned one or more analysis properties (e.g., a mesh resolution, a boundary condition, a material property, and the like) and one or more voxels based on a location of the one or more components. In one embodiment, the computer-executable instructions for transferring properties are stored and executed from a memory area remote from computing device 102. For example, instructions may be stored in a cloud service, a database, or other memory area accessible by computing device 102. Such embodiments reduce the computational and storage burden on computing device 102. As such, memory area 106 may be a local and/or a remote computer storage media including memory storage devices.

Processor 110 executes computer-executable instructions for implementing aspects of the disclosure. In some embodiments, processor 110 is transformed into a special purpose microprocessor by executing computer-executable instructions or by otherwise being programmed. For example, one or more computer-readable media include computer-executable instructions for instructing processor 110 to execute the steps as illustrated in FIG. 2.

In one embodiment, a display may be integrated into computing device 102, for example, a capacitive touch screen display, or a non-capacitive display. User input functionality may be provided in the display where the display acts as a user input selection device such as in a touch screen.

Figure 2:
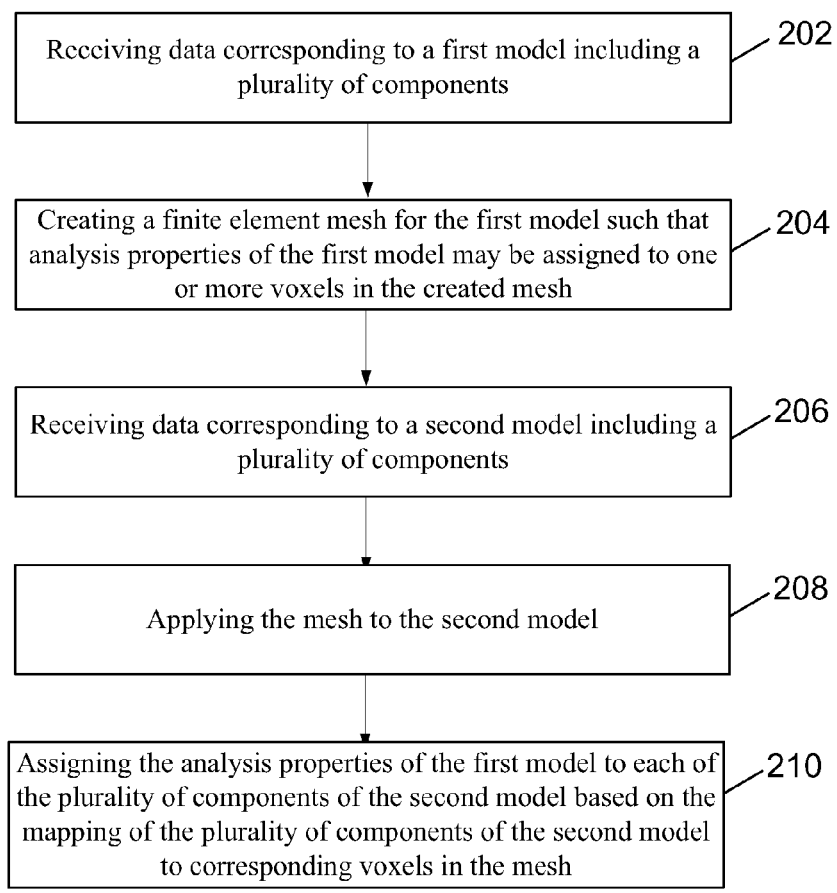
FIG. 2 is an exemplary flow chart illustrating a process for transferring analysis properties between geometry models.

Referring next to FIG. 2, an exemplary flow chart illustrating a process 200 for transferring analysis properties between geometry models is shown. At 202, data corresponding to a host model that includes a plurality of components is received. At 204, a finite element mesh (e.g., a Cartesian mesh) is created for the host model such that analysis properties of the host model may be assigned to locations on the mesh, for example, properties of the host model may be assigned to one or more voxels.

In one embodiment, the finite element mesh is automatically created using an algorithmic procedure that produces a valid finite element mesh in a domain of arbitrary complexity. For example, depending on whether 2-D or 3-D meshes are desired, two algorithms may be used. In one embodiment, a 2-D mesh (e.g., a quadtree structure) is generated for a 2-D host model, whereas a 3-D mesh (e.g., an octree structure) is generated for a 3-D host model. The resulting finite element meshes can be input to any finite element code with a formatting code.

Figure 3:
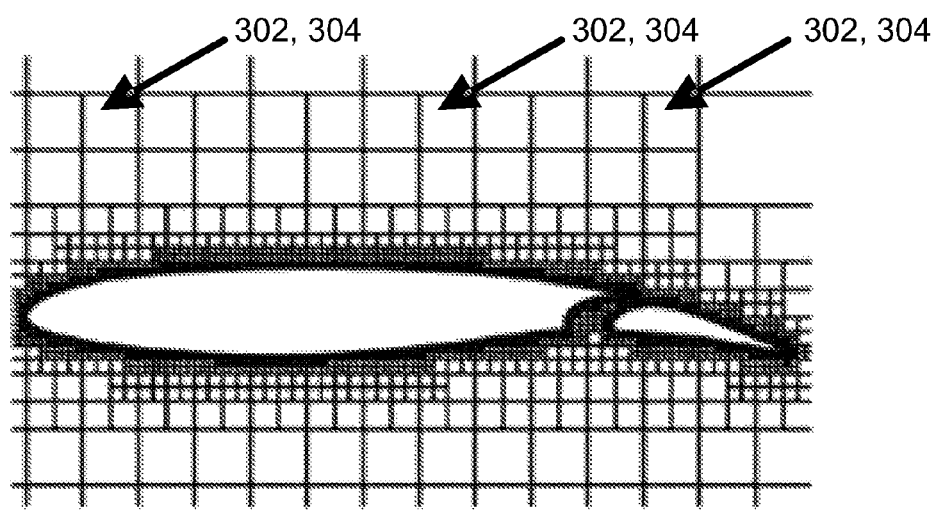
FIG. 3 is an illustrative example of a recursive subdivision of a model.

In one embodiment, a quadtree and/or an octree algorithm is used to decompose (e.g., build a tree) each voxel of the mesh by recursively subdividing voxels in the host model to the point where assigning analysis properties to a particular component of the host model can easily be performed. In tree-building, a quadtree and/or an octree approximation of the host model provides a collection of variably sized, non-overlapping voxels whose union approximates the host model. The quadtree or the octree approximation for a geometry is obtained through recursive subdivision of a physical space enclosing the host model. FIG. 3 shows a 2-D example of a recursive subdivision of a model.

The approximation process encloses the geometry with a square Cartesian box and subdivides the box into four/eight regular voxels (e.g., four cells in 2-D and eight cells in 3-D). In one embodiment, when a voxel is wholly interior or outside the geometry of the host model, the decomposition of that voxel ceases. When a voxel cannot be so classified, it is further subdivided into four/eight new voxels and the decomposition and classification process continues until the desired resolution is achieved. As such, the mesh may be represented by logical trees whose voxels have four/eight offsprings. As illustrated in FIG. 3, each voxel (e.g., voxel 302) corresponds to a cell (e.g. cell 304) in the recursive decomposition process.

In one embodiment, to avoid abrupt differences in mesh density, neighboring voxels have no more than a 2-to-1 level of difference by subdividing the larger octants to the appropriate level. Once the cell decomposition process has been completed, the host model is represented as the union of all voxels in the mesh where in any given voxel, the geometric complexity has been greatly reduced, thereby simplifying the property assignment process. As such, each voxel that intersects one or more geometry components includes information regarding a property of a component of the host model. In one embodiment, voxels are adaptively refined to resolve geometric features of the host model to a given tolerance.

At 206, data corresponding to a target model that includes a plurality of components is received. In one embodiment, the host model and the target model are similar, but non-congruent geometry models. For example, the target model may have less components than the host model, more components than the host model, or the same number of components with one or more components rearranged. Once changes to the structure of the host model have been made, all of the property specifications are re-assigned to the changed model (e.g., the target model), before the target model can be analyzed in various analysis tools. At 208, the mesh is applied (e.g., overlaid) with the target model. Thus, to locate each component of the target model in the mesh that includes information regarding the properties of the host model, the quadtree or octree structure of the mesh is interrogated. As such, each property of the host model can be mapped to the target model by evaluating the mesh functional representation at an appropriate location of the target model. However, components that lie outside voxels representing host model components may be assigned properties based on, for example, a proximity of a component to a voxel representing host model components, interpolation or extrapolation of properties from nearby voxels, and/or a property value may be left unassigned for later assignment by a user. For example, properties may be mapped to non-congruent portions of the target model using data interpolation or data extrapolation from nearby voxels containing properties assigned from the host model.

In one embodiment, assigning property specifications to the target model that represent a changed structure of the host model includes creating new properties and/or moving existing properties to the area/structure of the host model that changed. Once the new properties (if needed) are established and/or existing properties are moved to the area/structure of the host model that changed, the relationships of each property with the corresponding voxels in the mesh are reestablished. That is, each section of the mesh is defined by its location with respect to other grid areas. Therefore, when a structure of the host model is changed, the properties associated with the changed portion of the structure is reestablished with a corresponding section of the mesh. Using the analysis properties assigned to each voxel in the mesh, the plurality of components of the target model are mapped to an appropriate voxel in the mesh based on a location of each component in the target model with respect to the mesh. At 210, the analysis properties of the host model are assigned to each of the plurality of components of the target model based on the mapping of the plurality of components of the target model to corresponding voxels in the mesh.

Exemplary Operating Environment

A computer or computing device such as described herein has one or more processors or processing units, system memory, and some form of computer readable media. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Communication media typically embody computer readable instructions, data structures, program modules, or other data in a modulated data signal such as a carrier wave or other transport mechanism and include any information delivery media. Combinations of any of the above are also included within the scope of computer readable media.

The computing device may operate in a networked environment using logical connections to one or more remote computers. Although described in connection with an exemplary computing system environment, embodiments of the disclosure are operational with numerous other general purpose or special purpose computing system environments or configurations. The computing system environment is not intended to suggest any limitation as to the scope of use or functionality of any aspect of the disclosure. Moreover, the computing system environment should not be interpreted as having any dependency or requirement relating to any one or combination of components illustrated in the exemplary operating environment. Examples of well known computing systems, environments, and/or configurations that may be suitable for use with aspects of the disclosure include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the disclosure may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other embodiments of the disclosure may include different computer-executable instructions or components having more or less functionality than illustrated and described herein. Aspects of the disclosure may also be practiced in distributed computing environments where tasks are performed by remote processing devices that are linked through a communications network. In a distributed computing environment, program modules may be located in both local and remote computer storage media including memory storage devices.

The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A system configured to enable a transfer of analysis properties between geometry models, the system comprising:
 a memory area for storing analysis properties of a first geometry model associated with a first object, the first geometry model comprising a plurality of components, each of the plurality of components being assigned one or more of the analysis properties, such that the one or more of the analysis properties are associated with one or more voxels in a mesh based on a location of one or more components of the plurality of components; and a processor programmed to:
  receive data corresponding to a second geometry model associated with a second object different from the first object, the second geometry model comprising a plurality of components;
  access the analysis properties of the plurality of components of the first geometry model;
  overlay the second geometry model with the mesh;
  using the mesh and the analysis properties associated with the voxels in the mesh, map the plurality of components of the second geometry model to the voxels in the overlaid mesh; and
  assign the analysis properties of the plurality of components of the first geometry model to each of the plurality of components of the second geometry model based on the mapping of the plurality of components of the second geometry model to the voxels in the overlaid mesh.

2. A system in accordance with claim 1, wherein the mesh is a Cartesian background mesh.

3. A system in accordance with claim 1, wherein the first geometry model and the second geometry model are three-dimensional models.

4. A system in accordance with claim 1, wherein the second geometry model includes more components than the first geometry model.

5. A system in accordance with claim 1, wherein the first geometry model includes more components than the second geometry model.

6. A system in accordance with claim 1, wherein the first and second geometry models are non-congruent.

7. A system in accordance with claim 1, wherein the first geometry model was created in a program that does not enable the analysis properties of the first geometry model to be transferred to a geometry model created outside of the program.

8. A method for transferring analysis properties between geometry models, the method comprising:
  receiving data corresponding to a first geometry model associated with a first object, the first geometry model comprising a plurality of components, each of the plurality of components comprising one or more analysis properties;
  associating, by a processor, each of the analysis properties with one or more voxels in a mesh based on a location of a respective component of the plurality of components;
  receiving data corresponding to a second geometry model associated with a second object different from the first object, the second geometry model comprising a plurality of components;
  overlaying the second geometry model with the mesh;
  using the mesh and the analysis properties associated with the voxels, in the mesh, mapping, by the processor, the plurality of components of the second geometry model to the voxels in the overlaid mesh; and
  assigning the analysis properties of the plurality of components of the first geometry model to each of the plurality of components of the second geometry model based on the mapping of the plurality of components of the second geometry model to the voxels in the overlaid mesh.

9. A method in accordance with claim 8, wherein associating each of the analysis properties with one or more voxels in a mesh based on a location of a respective component of the plurality of components comprises associating each of the analysis properties with one or more voxels in a Cartesian background mesh.

10. A method in accordance with claim 9, wherein the mesh comprises an octree data structure, and wherein mapping the plurality of components of the second geometry model to the voxels in the overlaid mesh comprises mapping the plurality of components to a particular resolution voxel in the octree data structure.

11. A method in accordance with claim 8, wherein associating each of the analysis properties with one or more voxels in a mesh based on a location of a respective component of the plurality of components comprises assigning one more of the following: a mesh resolution, a boundary condition, and a material property.

12. One or more non-transitory computer-readable media comprising computer-executable instructions for transferring analysis properties between geometry models, the computer-executable instructions directing a processor to:
  access data corresponding to a first geometry model associated with a first object, the first geometry model comprising a plurality of components, each of the plurality of components comprising one or more analysis properties;
  associate each of the analysis properties with one or more voxels in a mesh based on a location of a respective component of the plurality of components;
  access data corresponding to a second geometry model associated with a second object different from the first object, the second geometry model comprising a plurality of components;
  overlay the second geometry model with the mesh;
  using the mesh and the analysis properties associated with the voxels in the mesh, map the plurality of components of the second geometry model to the voxels in the overlaid mesh; and
  assign the analysis properties of the plurality of components of the first geometry model to each of the plurality of components of the second geometry model based on the mapping of the plurality of components of the second geometry model to the voxels in the overlaid mesh.

13. The non-transitory computer-readable media of claim 12, wherein the computer-executable instructions further direct a processor to associate each of the analysis properties with one or more voxels in a Cartesian background mesh.

14. The non-transitory computer-readable media of claim 12, wherein the mesh comprises an octree data structure, and wherein the computer-executable instructions further direct a processor to map the plurality of components to a particular resolution voxel in the octree data structure.

15. The non-transitory computer-readable media of claim 12, wherein the computer-executable instructions further direct a processor to assign one more of the following: a mesh resolution, a boundary condition, and a material property.

16. The non-transitory computer-readable media of claim 12, wherein the second geometry model includes more components than the first geometry model or wherein the first geometry model includes more components than the second geometry model.

17. The non-transitory computer-readable media of claim 12, wherein the first geometry model was created in a program that does not enable the analysis properties of the first geometry model to be transferred to a geometry model created outside of the program.

18. The non-transitory computer-readable media of claim 12, wherein neighboring voxels have no more than a 2-to-1 level of difference.

19. The non-transitory computer-readable media of claim 12, wherein the computer-executable instructions further direct a processor to refine the one or more voxels of the mesh to resolve geometric features of the first geometry model to a given tolerance.

20. The non-transitory computer-readable media of claim 12, wherein the computer-executable instructions further direct a processor to map the analysis properties assigned to each voxel in the mesh to non-congruent portions of the second geometry model using data interpolation or data extrapolation from nearby voxels wherein the nearby voxels include properties assigned from the first geometry model.

21. The method of claim 8, further comprising generating the voxels in the mesh by recursively subdividing a space enclosing the first geometry model.

22. The method of claim 8, wherein associating each of the analysis properties with one or more voxels in a mesh based on a location of a respective component of the plurality of components comprises representing the one or more analysis properties by a mathematical basis function associated with a respective voxel of the mesh.

23. The method of claim 8, wherein associating each of the analysis properties with one or more voxels in a mesh based on a location of a respective component of the plurality of components comprises generating an octree data structure for the mesh, and wherein overlaying the second geometry model with the mesh and mapping the plurality of components of the second model to the voxels in the overlaid mesh comprises interrogating the octree data structure of the mesh.

* * * * *